US008706966B1

(12) United States Patent
Kraipak et al.

(10) Patent No.: US 8,706,966 B1
(45) Date of Patent: Apr. 22, 2014

(54) SYSTEM AND METHOD FOR ADAPTIVELY CONFIGURING AN L2 CACHE MEMORY MESH

(75) Inventors: Waseem Saify Kraipak, Maharashtra (IN); George Bendak, San Diego, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 244 days.

(21) Appl. No.: 13/115,029

(22) Filed: May 24, 2011

Related U.S. Application Data

(63) Continuation-in-part of application No. 12/763,110, filed on Apr. 19, 2010, which is a continuation-in-part of application No. 12/729,210, filed on Mar. 22, 2010, now Pat. No. 8,438,358, which is a continuation-in-part of application No. 12/687,817, filed on Jan. 14, 2010, which is a continuation-in-part of application No. 12/639,064, filed on Dec. 16, 2009.

(51) Int. Cl.
*G06F 12/00* (2006.01)
*G06F 13/00* (2006.01)
*G06F 13/28* (2006.01)

(52) U.S. Cl.
USPC ........... 711/118; 711/119; 711/120; 711/121; 711/130; 711/148

(58) Field of Classification Search
USPC .................. 711/118, 119, 120, 121, 130, 148
See application file for complete search history.

(56) References Cited

U.S. PATENT DOCUMENTS

| | | | | |
|---|---|---|---|---|
| 5,895,487 A * | 4/1999 | Boyd et al. | ..................... | 711/122 |
| 7,168,070 B2 * | 1/2007 | Archambault et al. | ....... | 717/151 |
| 7,290,116 B1 * | 10/2007 | Grohoski et al. | ............. | 711/216 |
| 7,530,070 B1 * | 5/2009 | Mera et al. | ..................... | 718/104 |
| 7,941,595 B2 * | 5/2011 | Bullen et al. | .................. | 711/109 |
| 8,171,223 B2 * | 5/2012 | Hughes et al. | ................. | 711/121 |
| 8,271,735 B2 * | 9/2012 | Cypher | ......................... | 711/130 |
| 8,296,520 B2 * | 10/2012 | Le et al. | ........................ | 711/124 |
| 2008/0059712 A1 | 3/2008 | Fedorova | | |
| 2009/0055627 A1 | 2/2009 | Giacomoni et al. | | |
| 2009/0307434 A1 * | 12/2009 | Sivaramakrishnan et al. | ............................ | 711/147 |
| 2010/0131712 A1 | 5/2010 | Duvalsaint et al. | | |
| 2010/0131713 A1 | 5/2010 | Duvalsaint et al. | | |
| 2010/0131716 A1 | 5/2010 | Duvalsaint et al. | | |
| 2010/0131717 A1 | 5/2010 | Dumarot et al. | | |
| 2010/0153678 A1 | 6/2010 | Kang et al. | | |
| 2011/0022754 A1 * | 1/2011 | Cidon et al. | .................. | 710/107 |

OTHER PUBLICATIONS

Rolf, Trent; Cache Organization and Memory Management of the Intel Nehalem Computer Architecture; Univ of Utah Computer Engineering CS6810 Final Project; Dec. 2009; USA.

Fedorova, Alexandra, et al.; Managing Contention for Shared Resources on Multicore Processors; ACM 1542-7730/10/0100; 2009; pp. 1-16; USA.

Merkel, Andreas & Bellosa, Frank; Memory-Aware Scheduling for Energy Efficiency on Multicore Processors; Univ of Karlsruhe; Not Dated; Germany.

* cited by examiner

*Primary Examiner* — Michael Alsip

(57) ABSTRACT

A system and method are provided for adaptively configuring L2 cache memory usage in a system of microprocessors. A system-on-chip (SoC) is provided with a plurality of n selectively enabled processor cores and a plurality of n L2 cache memories. The method associates each L2 cache with a corresponding processor core, and shares the n L2 caches between enabled processor cores. More explicitly, associating each L2 cache with the corresponding processor core means connecting each processor core to its L2 cache using an L2 data/address bus. Sharing the n L2 caches with enabled processors means connecting each processor core to each L2 cache via a data/address bus mesh with dedicated point-to-point connections.

17 Claims, 8 Drawing Sheets

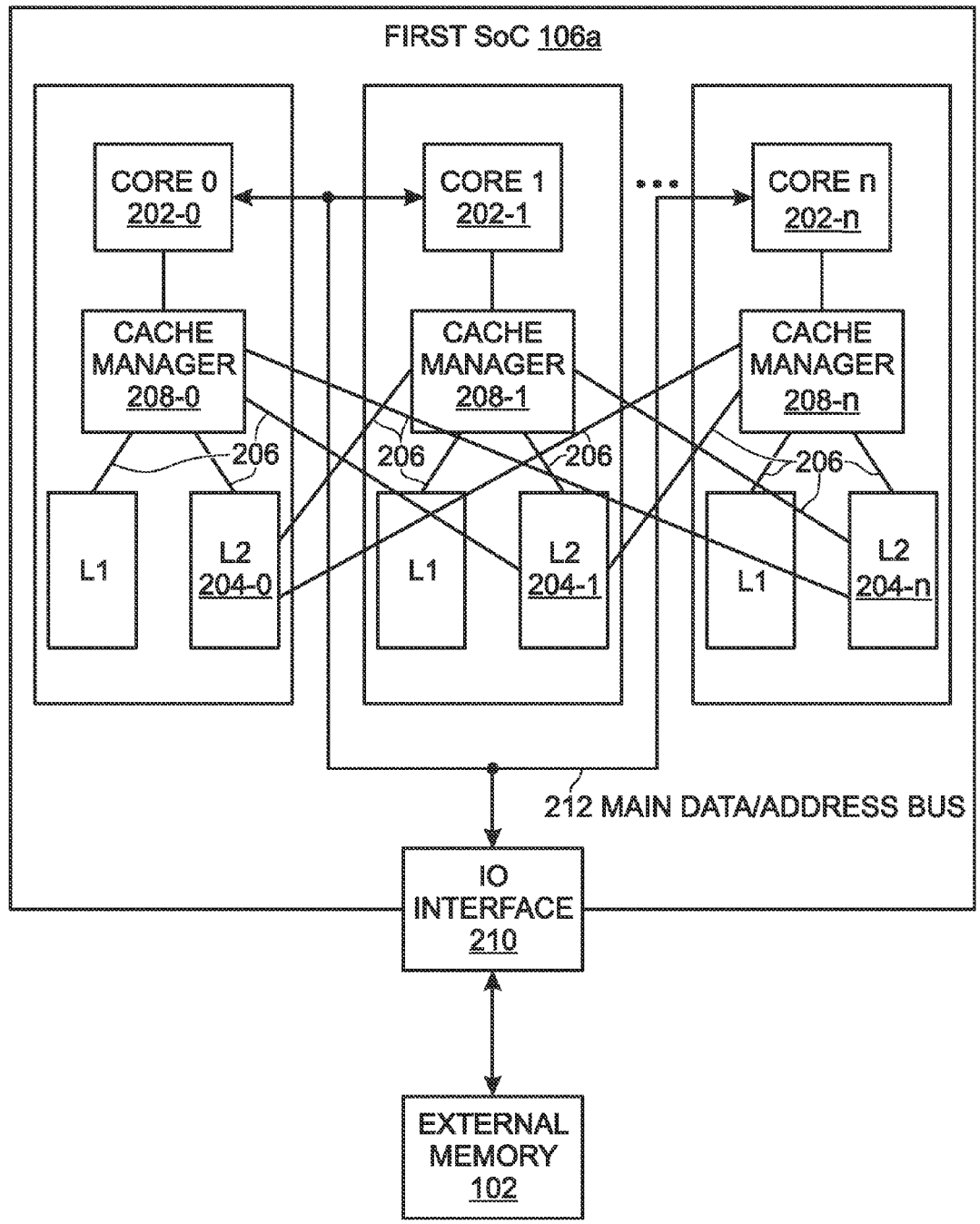

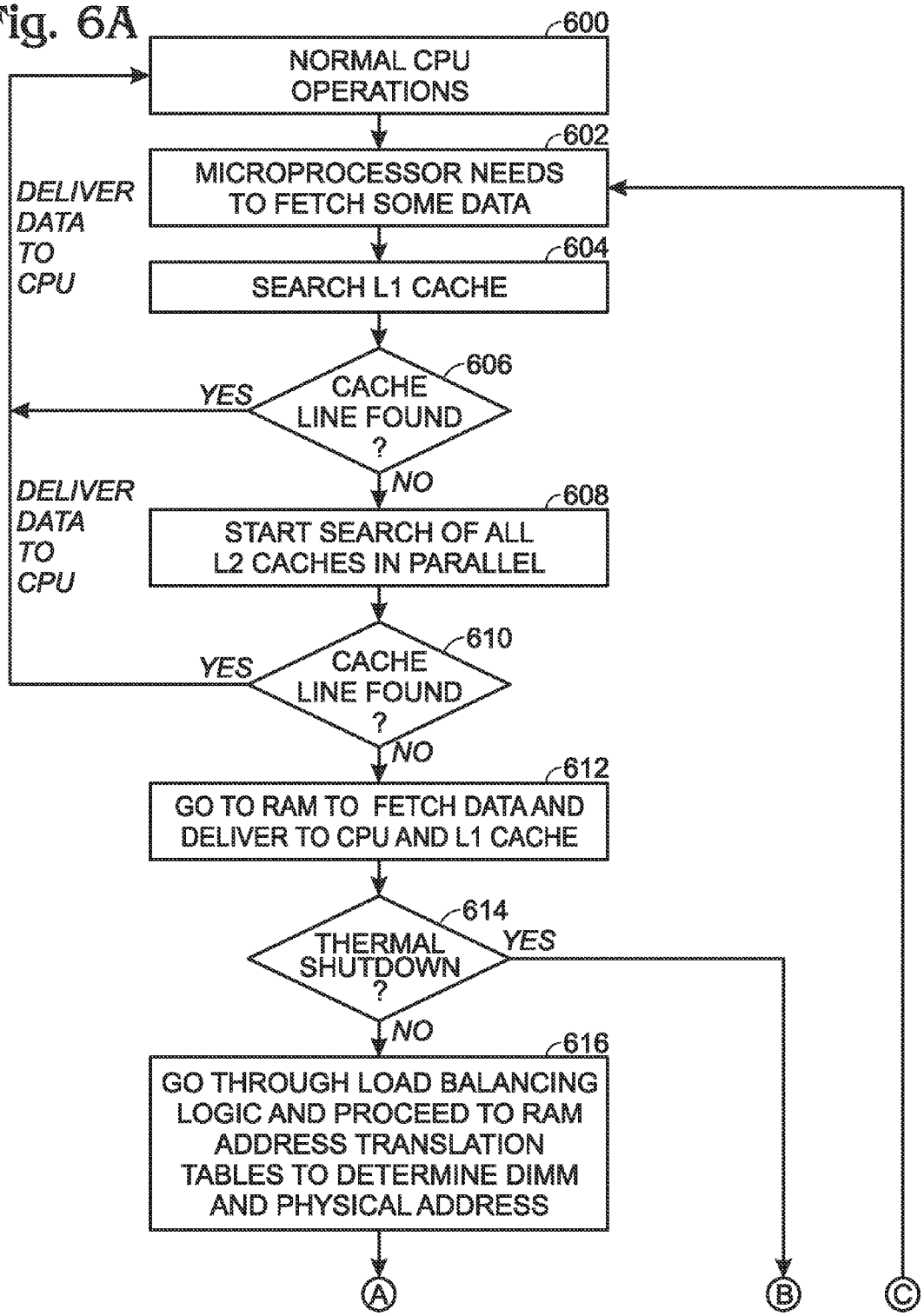

SYSTEM AND METHOD FOR ADAPTIVELY CONFIGURING AN L2 CACHE MEMORY MESH

RELATED APPLICATIONS

This application is a Continuation-in-Part of a patent application entitled, SYSTEM-ON-CHIP WITH DYNAMIC MEMORY MODULE SWITCHING, invented by Waseem Kraipak et al, Ser. No. 12/763,110, filed Apr. 19, 2010;

which is a Continuation-in-Part of a patent application entitled, SYSTEM-ON-CHIP WITH MEMORY SPEED CONTROL CORE, invented by Waseem Kraipak et al, Ser. No. 12/729,210, filed Mar. 22, 2010 now U.S. Pat. No. 8,438,358;

which is a Continuation-in-Part of a pending application entitled, SYSTEM-ON-CHIP WITH THERMAL MANAGEMENT CORE, invented by Waseem Kraipak et al., Ser. No. 12/687,817, filed Jan. 14, 2010;

which is a Continuation-in-Part of a pending application entitled, SYSTEM-ON-CHIP WITH FEEDBACK LOOP FOR PROCESSOR FREQUENCY CONTROL, invented by Waseem Kraipak et al., Ser. No. 12/639,064, filed Dec. 16, 2009. All the above-listed applications are incorporated herein by reference.

BACKGROUND OF THE INVENTION

1. Field of the Invention

This invention generally relates to processor cache memory and, more particularly, to a system and method for sharing L2 cache memories between processors without using snooping logic.

2. Description of the Related Art

As noted in Wikipedia, cache is a memory used by the central processing unit (CPU) or processor of a computer to reduce the average time to access memory. The cache is a smaller, faster memory that stores copies of the data from the most frequently used main memory locations. As long as most memory accesses are cached memory locations, the average latency of memory accesses is closer to the cache latency than to the latency of main memory.

When the processor needs to read from, or write to a location in main memory, it first checks whether a copy of that data is in the cache. If so, the processor immediately reads from, or writes to the cache, which is much faster than reading from, or writing to main memory.

Most modern desktop and server CPUs have at least three independent caches: an instruction cache to speed up executable instruction fetch, a data cache to speed up data fetch and store, and a translation lookaside buffer (TLB) used to speed up virtual-to-physical address translation for both executable instructions and data. Data cache is usually organized as a hierarchy of more cache levels (L1, L2, etc.).

Larger caches have better hit rates but longer latency. To address this tradeoff, many computers use multiple levels of cache, with small fast caches backed up by larger slower caches. Multi-level caches generally operate by checking the smallest Level 1 (L1) cache first; if it hits, the processor proceeds at high speed. If the smaller cache misses, the next larger cache (L2) is checked, and so on, before external memory is checked.

Convention system-on-chip (SoC) devices with multiple processors have combined instruction and data caches at the L2 level. At the L1 level, it is not uncommon to have distinct L1 instruction and data caches for maximum memory access. However, this segmentation concept does not extend to the L2 level. In a multi-processor SoC, the L2 caches cannot be shared between processors. Thus, if a processor is shutdown, its associated L2 cache is shutdown, which is a waste of memory.

FIG. 9 is a schematic diagram of a multi-cache system using processor local bus to conduct snoop requests (prior art). In a conventional system, upon an L1 miss, the local L2 cache is queried. If it has the line, the L2 cache sends it to the L1 cache. If the L2 cache does not have the line, a snoop is then generated. A snoop request travels down to the PLB (processor local bus) and is propagated to the other L2 caches. The results (whether a hit or miss) then come back via the PLB. If there is no match, then the main memory is accessed to retrieve the data. The process of generating a snoop and getting the responses back via the PLB takes many clock cycles. If there is a complete L2 miss, then there is a large delay in beginning the read of the data from external memory.

It would be advantageous if the L2 caches of a multi-processor SoC could be dynamically shared based upon processor power states.

It would be advantageous if the latency in searching non-local L2 caches could be minimized.

SUMMARY OF THE INVENTION

Described herein are a system and method through which each core (processor) in a multi-core system-on-chip (SoC) can independently access a dedicated external memory (e.g., dual in-line memory module (DIMM)). The memory hierarchy is divided between multiple cores giving each core its own physical memory. In another mode, cores can share all the memories in a manner that maintains maximum throughput to and from the memories.

Another aspect of the invention concerns the interface between L1 and L2 caches. Instead of an L2 cache being fully dedicated to an L1 cache and its core, a mesh/bus connection is formed between all the L1's and all the L2's such that if there is an L1 miss, all the L2's can simultaneously be searched without resorting to snoop operations. This process greatly decreases the time to find a cache hit. The L1s are all configured for write-through in this case. In one aspect, the VDD supply for the L2 caches is separate from the VDD supply of the cores, so that the L2's can be shared. That is, there is no contention for memory access between the cores, and instructions and data do not compete for cache space or cache bandwidth since there are dedicated L1 caches for each.

Memory bus configuration logic automatically detects and configures core-to-DIMM connectivity based on what is installed. It can also enable load sharing between the memories based on access requirements instead of just address lookup. When a core is shut down, its unused L2 cache can automatically be used by other cores. The addition of connectivity between an L1 and all the L2s removes the need for time consuming snoop operations in the case of an L2 cache miss, since all the L2s are simultaneously searched in the event of an L1 miss.

Accordingly, a method is provided for adaptively configuring L2 cache memory usage in a system of microprocessors. An SoC is provided with a plurality of n selectively enabled processor cores and a plurality of n L2 cache memories. The method associates each L2 cache with a corresponding processor core, and shares the n L2 caches between enabled processor cores. More explicitly, associating each L2 cache with the corresponding processor core means connecting each processor core to its L2 cache using an L2 data/address bus. Sharing the n L2 caches with enabled processors means connecting each processor core to each L2 cache via a data/address bus mesh with dedicated point-to-point connections.

In one aspect, an L2 cache manager associated with an enabled processor searches its own L2 cache for a first message. So that sharing the n L2 caches means that the L2 cache manager searches for the first message in the other (n−1) shared L2 caches. In another aspect, the SoC has an input/output (IO) interface connected to an external memory. Subsequent to enabling a previously disabled first processor core, the method transfers information stored in a first L2 cache, associated with the first processor core, by processor cores other than the first processing core, to external memory.

Additional details of the above-described method, and an SoC with a system for adaptively configuring L2 cache memory usage between a plurality of microprocessors, are provided below.

BRIEF DESCRIPTION OF THE DRAWINGS

FIG. 2 is a schematic block diagram depicting the SoC of FIG. 1 in greater detail.

FIGS. 6A and 6B are flowcharts illustrating bus configuration logic, load balancing, and thermal analysis.

DETAILED DESCRIPTION

Figure 1:
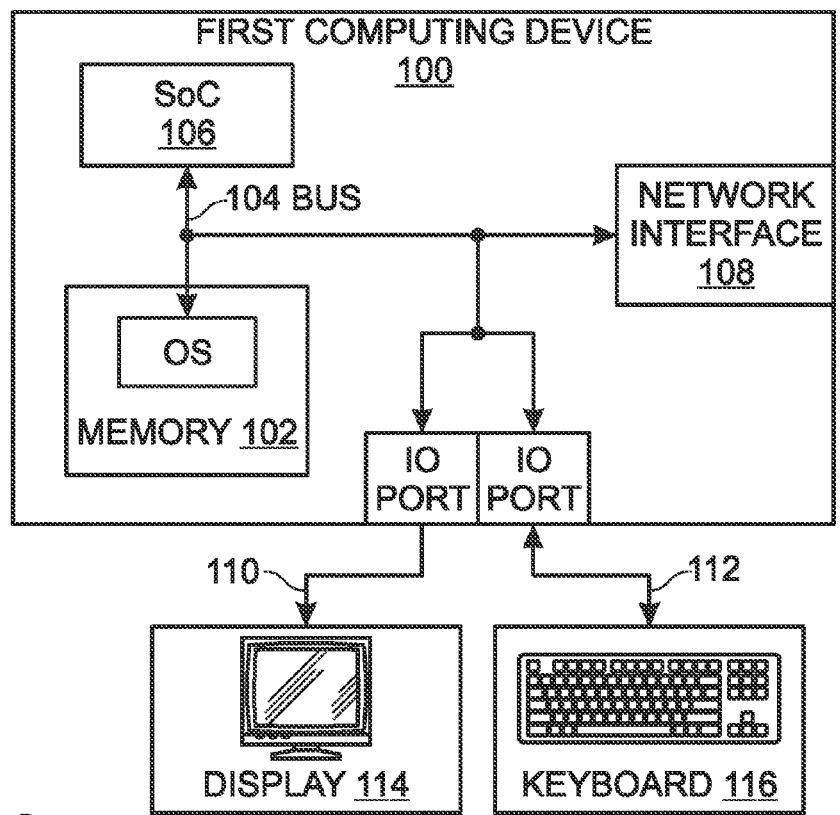
FIG. 1 is a schematic block diagram of a computer device capable of supporting the SoC system described below.
Figure 9:
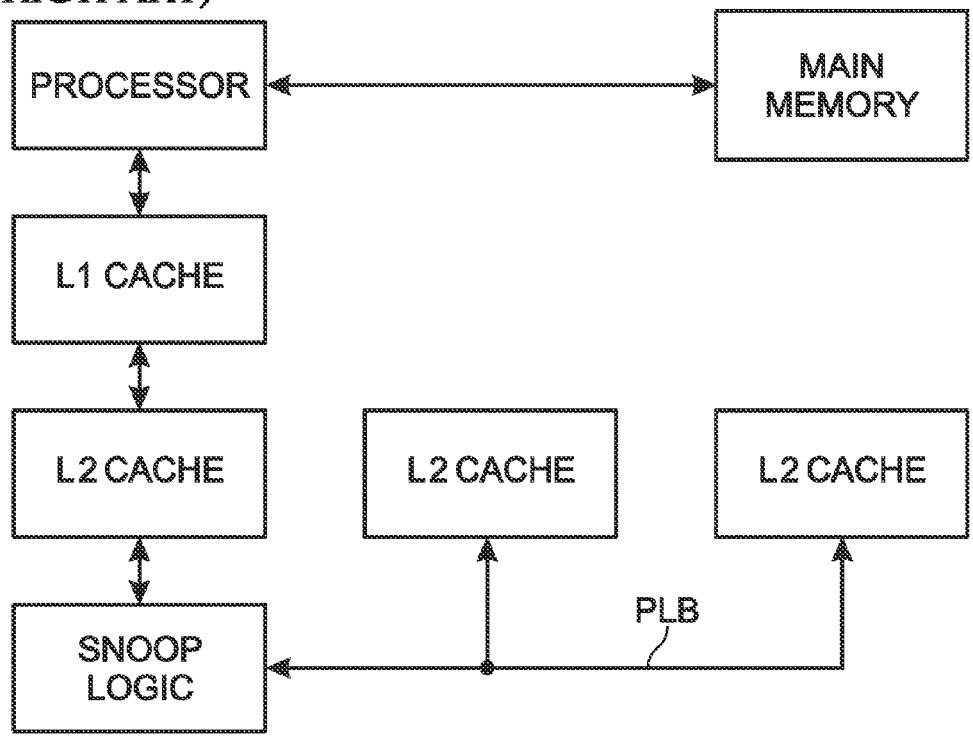
FIG. 9 is a schematic diagram of a multi-cache system using processor local bus to conduct snoop requests (prior art).

As used in this application, the terms "component," "module," "system," and the like may be intended to refer to an automated computing system entity, such as hardware, firmware, a combination of hardware and software, software, software stored on a computer-readable medium, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

The computer devices described below typically employ a computer system with a bus or other communication mechanism for communicating information, and a processor coupled to the bus for processing information. The computer system may also includes a main memory, such as a random access memory (RAM) or other dynamic storage device, coupled to the bus for storing information and instructions to be executed by a processor. These memories may also be referred to as a computer-readable medium. The execution of the sequences of instructions contained in a computer-readable medium may cause a processor to perform some of the steps associated with memory access and management. Alternately, these functions are performed in hardware. The practical implementation of such a computer system would be well known to one with skill in the art.

As used herein, the term "computer-readable medium" refers to any medium that participates in providing instructions to a processor for execution. Such a medium may take many forms, including but not limited to, non-volatile media, volatile media, and transmission media. Non-volatile media includes, for example, optical or magnetic disks. Volatile media includes dynamic memory. Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

SoC—System-on-Chip;

DIMM—dual in-line memory module;

BIOS—basic input/output system;

SPD—serial presence detect—a small non-volatile (NV) memory on the DIMM, contains DIMM type (DDR1/2/3, operating frequency, memory size, etc.). BIOS reads the SPD on power-up and then initializes the DDR controllers.

DDR—Double Data Rate—a type of memory device access, referred to herein as a memory external to the SoC, that clocks on both rising and falling edges of the clock. A DIMM is an example of a DDR memory module implementation. Quad Data Rate (QDR) memories also exist.

Snoop—An operation to maintain cache coherency. In the case of a cache miss, operations are started to search/snoop other caches before proceeding to external memory. Snoop is also used to maintain IO coherency. If an IO wants to write to a memory location, the core caches are snooped to determine if there is any item for that memory location in the cache. If there is, and it is in a modify state, then the CPU pushes the cache data to the external memory and invalidates the cache line. The IO also writes to the specific memory location with the new data.

FIG. 1 is a schematic block diagram of a computer device capable of supporting the SoC system described below. The computing device 100 may also be a personal computer (PC), workstation, or server. An exemplary computer device typically includes a central processing unit (CPU), memories 102, and an interconnect bus 104. The computing device of FIG. 1 includes a plurality of CPUs enabled on SoC 106, as described in more detail below. The memories 102 may include a main memory, a read only memory, and mass storage devices such as various disk drives, tape drives, DIMM, DRR, etc. In operation, the main memory stores at least portions of instructions and data for execution by the SoC processors.

The computing device 100 may also include one or more network interface 108 for communications, for example, an interface for data communications via a network. The interface 108 may be a modem, an Ethernet card, or any other appropriate data communications device. The physical communication links may be optical, wired, or wireless.

The computer device 100 may further include appropriate input/output ports on lines 110 and 112 for user interface interconnection, respectively, with a display 114 and a keyboard 116. For example, the first computer device may include a graphics subsystem to drive the output display. The output display 114 may include a cathode ray tube (CRT) display or liquid crystal display (LCD). The input control devices for such an implementation may include the keyboard for inputting alphanumeric and other key information. The input control devices on line 112 may further include a cursor control device (not shown), such as a mouse, a touchpad, a trackball, stylus, or cursor direction keys. The links to the peripherals on line 112 may be wired connections or use wireless communications.

FIG. 2 is a schematic block diagram depicting the SoC of FIG. 1 in greater detail. The SoC is part of a system 200 for adaptively configuring L2 cache memory usage between a plurality of microprocessors. The system 200 comprises a first SoC 106a with a plurality of n selectively enabled processor cores 202. Shown are processor cores 202-0 through 202-n, where n is an integer not limited to any particular value. The first SoC 106a also comprises a plurality of n L2 caches 204-0 through 204-n. Each L2 cache 204 is associated with a corresponding processor core 202. A data/address bus mesh 206 provides dedicated point-to-point connections between each processor core 202 and each L2 cache 204. As shown, a cache manager 208 is interposed between each processor core and its L2 cache. The cache manager 208 may be part of the processor core, or as shown, an independent hardware element.

The cache manager or search engine 208 is a small piece of logic which has the exclusive task of, whenever there is a miss from L1, starting a cache search in its own L2, and in parallel, sending a search request to the other L2's. If it finds the data in its own L2 cache first, then it cancels the request to the other L2 caches. If the data is found in one of the other L2 caches first, then the data is forwarded to the cache manager that initiated the search. Doing the searches in parallel eliminates the several cycle wait time of sequential cache searches and snoops. In one aspect, each L1 and L2 cache has its own cache controller/manager. In this aspect, the L2 cache manager has additional logic for conducting searches in other L2 caches.

An input/output (IO) interface 210 is connected to external memory 102. A main data/address bus 212 connects each processor core 202 to the IO interface 210. If a first processor core, e.g., processor 202-0, is enabled subsequent to being in a disabled state, the first L2 cache 204-0 associated with the first processor core 202-0 transfers information stored in the first L2 cache by processor cores other than the first processing core (e.g., processor cores 202-1 and 202-n), to external memory 102. Alternatively, all data in the first L2 cache is flushed to external memory or simply overwritten.

In one aspect, a second L2 cache (e.g., L2 cache 204-1), associated with an enabled second processor core 202-1, adds a message to a first L2 cache 204-0 associated with the first processor core 202-0, subsequent to the first processor core being disabled. In another aspect, the second cache manager (e.g., 208-1) associated with an enabled second processor 202-1 searches its second L2 cache 204-1 for the first message (via mesh 206-1), and searches for the first message in the other (n−1) shared L2 caches. The second cache manager 208-1 may search the (n−1) shared L2 caches (204-0 and 204-n) either simultaneously with, or subsequent to searching its own L2 cache 204-1. In another aspect, the second cache manager 208-1 reads the first message from the external memory 102 while simultaneously searching the other (n−1) shared L2 caches. In the event of finding the first message in an L2 cache, the second cache manager 204-1 discontinues the read from the external memory 102.

Figure 3:
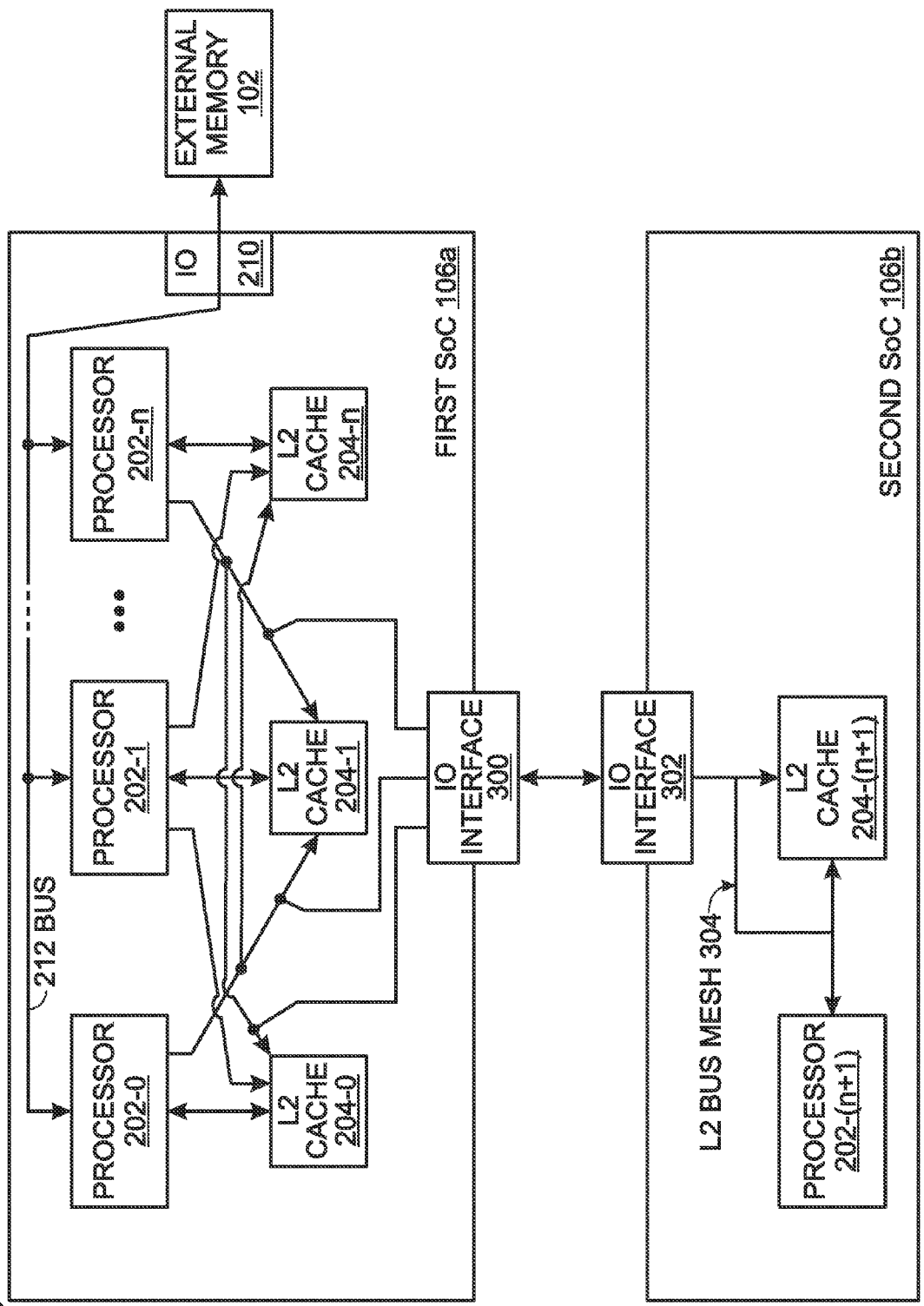
FIG. 3 is a schematic block diagram of a system enabled using at least two SoC.

FIG. 3 is a schematic block diagram of a system 200 enabled using at least two SoC. An IO interface 300 is connected to the first SOC L2 data/address bus mesh 206, and to an IO interface 302 of a second SoC 106b. The second SoC 106b includes at least one selectively enabled processor core 202-(n+1), associated L2 cache 204-(n+1), and an L2 data/address bus mesh 304 connected to its L2 cache 204-(n+1) and its IO interface 302. The n L2 caches 204 of the first SoC 106a and L2 cache 204-(n+1) of the second SoC 106b are shared between enabled processor cores in the first and second SoCs. Note: although two SoCs are shown, it should be understood that system is not limited to any particular number of SoCs. Likewise, second SoC 106b may comprise more than one processor.

In one aspect, the first SoC 106a has a second IO interface 210 connected to external memory 102. A first SoC main data/address bus 212 connects each processor core 202-0 through 202-n to the second IO interface 210. For example, a second L2 cache (e.g., 204-1) associated with an enabled second processor core 202-1 in the first SoC 106a searches its second L2 cache for a first message. That is, a cache manager (not shown) associated with second L2 cache searches. Second L2 cache 204-1 also searches for the first message in the shared L2 caches of the first and second SoCs 106a/106b, while simultaneously executing a read for the first message from the external memory 102. In the event of finding the first message in an L2 cache, the L2 cache 204-1 discontinues the read from the external memory 102.

In another aspect, the second L2 cache 204-1 associated with an enabled processor core 202-1 in the first SoC 106a, adds a message to L2 cache 204-(n+1) associated with processor core 202-(n+1) in the second SoC 106b, subsequent to processor core 202-(n+1) being disabled. Likewise, enabled processors in the first SoC 106b could add messages to the L2 caches of disabled processors in the first SoC 106a.

Functional Description

Note: The system of FIGS. 1-3 uses an operating system (OS) that is stored in memory 102 as a sequence of software instructions that is executed by a processor. The OS enables segmenting the memory to individual cores by controlling address spaces. To accomplish load balancing, simple remapping logic inside the SoC monitors accesses and determines where best to store data. The SoC can perform the segmentation of memory and the load balancing in one step, without relying on the OS. The remapping logic remaps the processor virtual addresses to physical addresses based on load balancing and/or bandwidth optimization algorithms.

Figure 4:
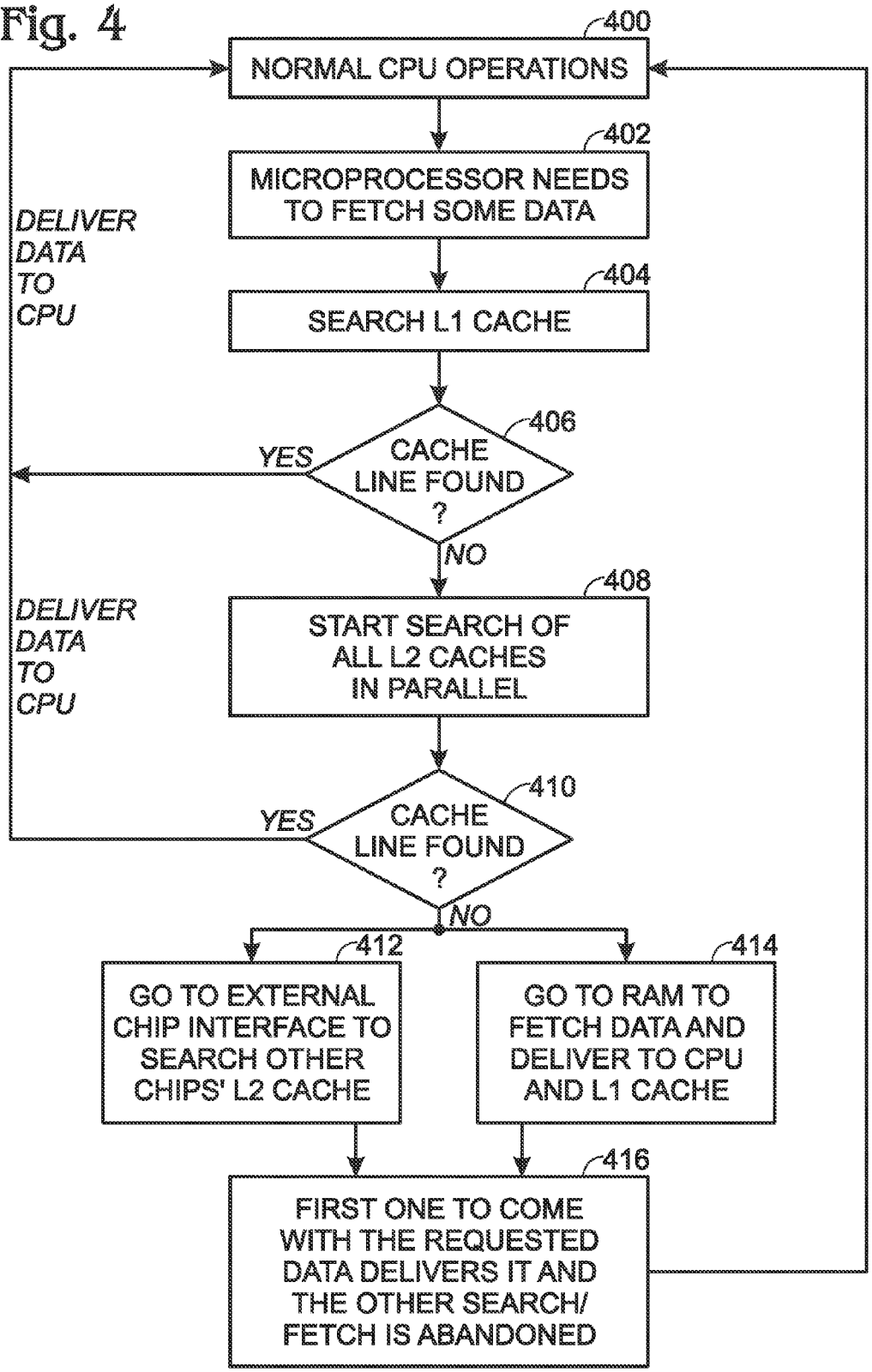
FIG. 4 is a flowchart illustrating cache operations—showing a general search and a cache miss.

FIG. 4 is a flowchart illustrating cache operations—showing a general search and a cache miss. In Step 402 a processor begins a data fetch. L1 is initially searched in Step 404. If a cache line is found in Step 406, the data is delivered to the processor. Otherwise, a parallel search of all L2 caches is performed in Step 408. If the cache line is found in Step 410, the data is delivered to the processor. If not, the data is sought in the L2 caches of connected SoCs (Step 412), and sought in RAM (Step 414). The first source finding the data delivers it to the processor in Step 416. Note: in some aspects Steps 412 and 414 are performed simultaneously with Step 408.

Figure 5:
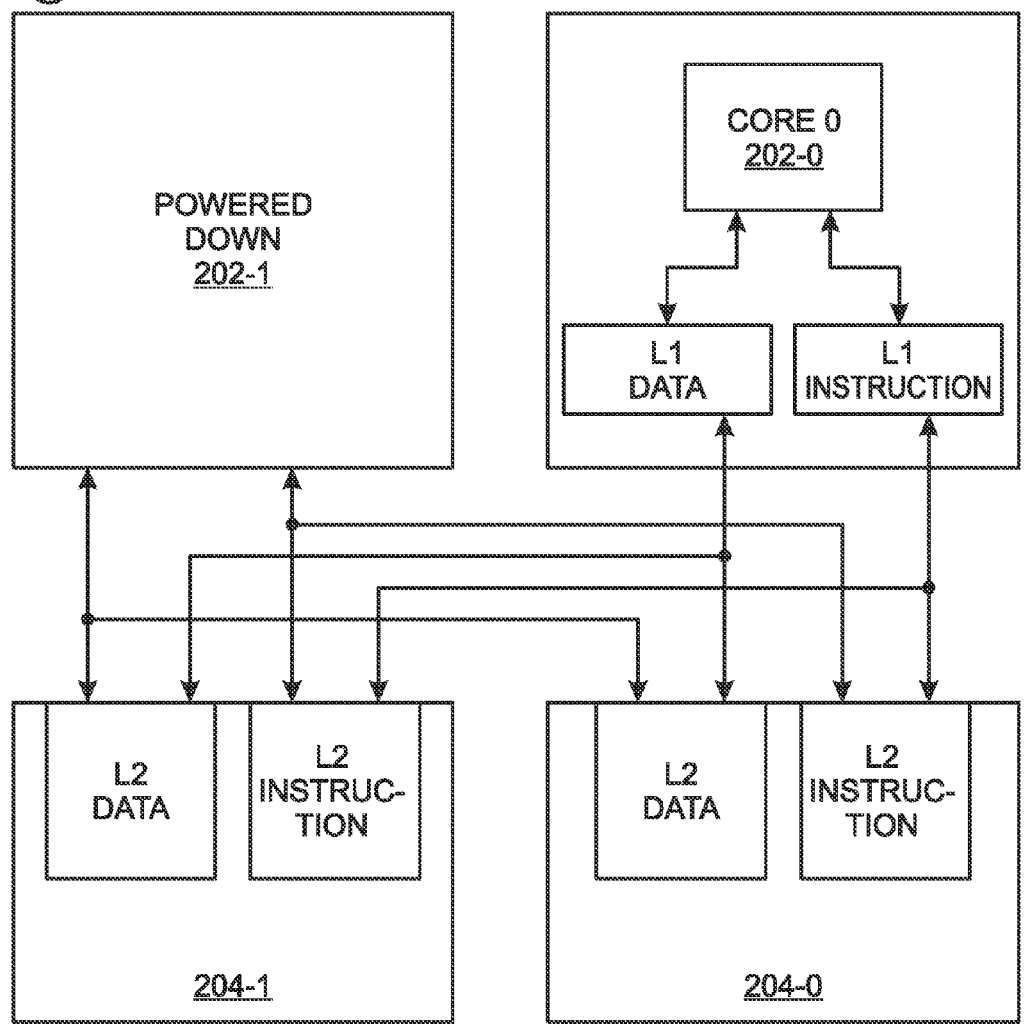
FIG. 5 is a schematic block diagram depicting interconnectivity between different L2 caches when one core is enabled and the other core is disabled.

FIG. 5 is a schematic block diagram depicting interconnectivity between different L2 caches when one core is enabled and the other core is disabled. When processor 202-1 is powered down, its L2 caches are left powered on. These L2 caches are appended (address space-wise) to the L2 caches 204-0 of processor 202-0. Once processor 202-1 is repowered, its caches 204-1 are returned to processor 202-1, and the cache lines between L2 cache 204-1 and processor 202-0 are declared invalid for the purpose of writing data, after their content is flushed to external memory.

Figure 6B:
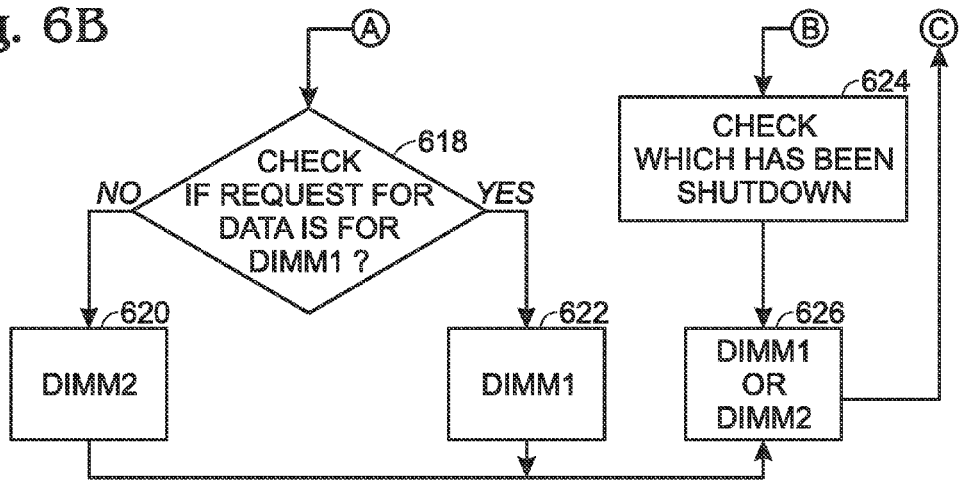

FIGS. 6A and 6B are flowcharts illustrating bus configuration logic, load balancing, and thermal analysis. In Step 602 a processor begins a data fetch. L1 is initially searched in Step 604. If a cache line is found in Step 606, the data is delivered to the processor. Otherwise, a parallel search of all L2 caches is performed in Step 608. If the cache line is found in Step 610, the data is delivered to the processor. If not, the data is sought in RAM (Step 612). In Step 614 a thermal analysis is considered. If there are no thermal problems associated with external memory 102, Steps 616 and 618 determine the external memory in which the data is stored—either memory 102a (DIMM1; Step 622) or memory 102b (DIMM2; Step 620. If Step 614 determines that a thermal problem exists, Step 624 and 626 determine if the data is in the overheated memory. If the data has been moved to another external memory, a thermal manager core tracks the move so that the data can subsequently be retrieved from the correct location.

Figure 7:
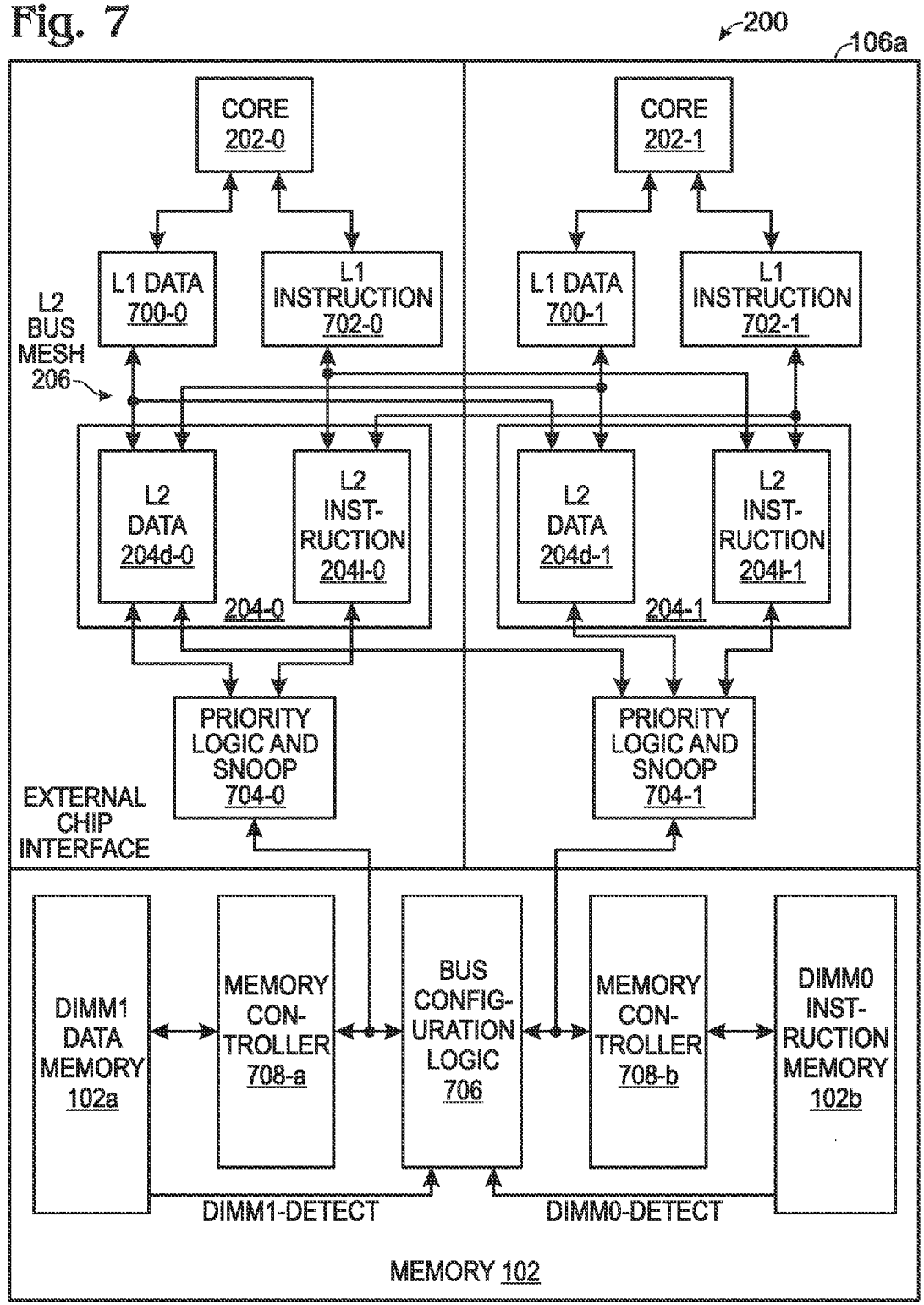
FIG. 7 is a schematic block diagram depicting a variation of the system for adaptively configuring L2 cache memory usage between a plurality of microprocessors.

FIG. 7 is a schematic block diagram depicting a variation of the system 200 for adaptively configuring L2 cache memory usage between a plurality of microprocessors. The example shows two cores for simplicity, although there is no limit on the number of cores. The L1 cache contains two memories, one for data 700 and one for instruction 702 caching. Keeping them separate allows for more efficient searches, greater bandwidth, and higher hit rates. The L2 level is also broken into data 204d and instruction 204i caches. Between the L1 and L2 levels is an interconnect system 206. The interconnect system 206 is a point-to-point bus that permits the L2 cache for all cores to be shared.

When a specific core has a miss in the L1 cache, the request is propagated to all the cores in the SoC 106a via the L2 bus mesh 206. The requested cache line is returned via the L2 bus mesh 206 to the L1 cache with the miss (generating the request). With this architecture, there is no need for snooping between the cores. Only IO coherency has to be supported, whereas the rest of the coherency is taken care of by the above-mentioned method. Further, the L2 cache need not support the MESI protocol, and only needs to support a valid/invalid tagging protocol, thus reducing the number of bits required and the required power.

As shown in FIG. 5, when one of the cores in the chip is shut down, its L2 caches can be appended to other cores' L2 caches to expand their depth. The deeper cache results in increased cache hit efficiency.

Returning to FIG. 7, the next layer after the L2 caching is the Priority Logic and SNOOP block 704. Each core has its own block 704. The Priority Logic and SNOOP block 704 has the functionality of enabling multiple SoCs to maintain coherency with each other. This would be the case in multichip server architectures. In the case of an L2 cache miss, the priority logic/snoop block 704 snoops the L2 caches of the other processor devices on the bus. In a server system where there are 8 SoCs, for example, and 7 of the SoCs are in sleep mode, the priority logic/snoop 704 permits the unused L2's to be dynamically added to the cores that are awake and functioning. The priority logic 704 is configured at power-on to enable the sharing of a core's L2 cache (and how much of the L2 cache) across a cluster of SoCs when its core is powered down.

Following the Priority Logic/Snoop block 704 is the interface to external memory 102. The interface consists of Bus Configuration Logic 706 and two or more memory controllers 708. In this example, only two DIMMs 102a and 102b are used, hence the use of two memory controllers 708. The bus configuration logic 706 is responsible for detecting the number, speed, and capacity of the DIMMs that are installed as well as other functions which are described in FIG. 6. In one configuration, the Bus Configuration Logic (BCL) 706 allows a DIMM and core to be paired together so that the DIMM is not shared and there is no impact on performance from tasks on neighboring cores. In another configuration, the BCL 706 can perform load balancing across the DIMMs. Load balancing across the DIMMs can yield a higher memory bandwidth available to specific tasks for short burst durations. In order to accomplish this without the awareness of the cores and the tasks, the BCL 706 has an address remapping capability permitting cross-correlation of the now "virtual" address requests from the cores with the true physical addresses.

The BCL 706 also takes into account thermal information when handling the load balancing across the DIMMs. In the case of a DIMM becoming overly heated due to a high duty cycle pattern of accesses, or due to physical issues such as dust accumulation or air circulation failure, the BCL 706 can bias the load balancing towards the cooler DIMM, in addition to reducing the operating frequency of the hot DIMM. Additional details can be found in the parent application entitled, SYSTEM-ON-CHIP WITH MEMORY SPEED CONTROL CORE, invented by Waseem Kraipak et al, Ser. No. 12/729,210, filed Mar. 22, 2010.

In addition to the above mentioned functions, the BCL 706 also has the capability of handling DIMM removal and replacements in case of a DIMM failure. The BCL 706 contains the logic to move the contents of one DIMM to other memories and to remap to those memories so that service can be performed without shutting down the system. This functionality is described in the parent application entitled, SYSTEM-ON-CHIP WITH DYNAMIC MEMORY MODULE SWITCHING, invented by Waseem Kraipak et al, Ser. No. 12/763,110, filed Apr. 19, 2010.

EXAMPLES

In a first scenario a user has a Quad core CPU and is running different applications on the CPU. In most circumstances, a single core is operational and the other cores are idle. If the user is running an application being executed on Core0, then Core1, Core2, and Core3 are just in the idle mode and are not executing any applications.

Given that the power management logic detects that Cores 1-3 are idle, it proceeds to shut them down, but keeps their L2 caches active, which in turn increases the L2 cache size for Core0 by a factor of three. Since the cache size has increased by 3×, its cache miss rate decreases by approximately 3× as well. Since the 3 cores are shut down, even their DDR (external) memories can be shared with Core0 so that Core0 has have more data space, but more importantly, it has 3× the memory bandwidth.

Each core has a dedicated region in the DDR that is reserved for itself that cannot be accessed by the other cores regardless of the state they are in. This is required to preserve the pre-shutdown state of the cores (registers, stacks, program counter value, etc.) so that they can be reliably powered up again. The non-locked areas can be accessed by other cores. It is not required that the cores be shutdown for the DDRs to be shared. This can also be done based on dynamic loading (i.e. one core needs more bandwidth than its DDR can support).

A second scenario is the same as above, except that Cores1-3 are active and executing different applications. Core1 through Core3 are not idle, so they are actively using their L2 caches. Although they are running different applications, the caches may still have information that is useful to the other cores. For example, if Core0 has an L1 miss, it sends a request in parallel to all the L2 caches to see if that particular cache line is in any of the L2 caches. If it is, it is then returned to the requesting Core. This eliminates the need to use the Snoop protocol.

In a third scenario every core has a dedicated DDR executing its own program to guarantee a memory bandwidth at the DDR level.

In a fourth scenario, if one of the DDRs is getting hot, the thermal management core can move the data out of it, into either other DDRs or other memories such as FLASH or Disk. The thermal management core, before moving the data out, may reduce the clock speed of the DDR. If the corresponding core needs the higher bandwidth, it can spread its accesses to other DDRs that are not having thermal issues.

In a fifth scenario each core organizes a portion of each DDR for itself. The memory load balancer can create out-of-order writes at DDR level. This has the advantage of creating memory banks external to a single DDR, thus increasing the overall speed of the system. By not having to wait for a single DDR's transactions to complete, the overall read/write bandwidth of the system is increased.

Figure 8:
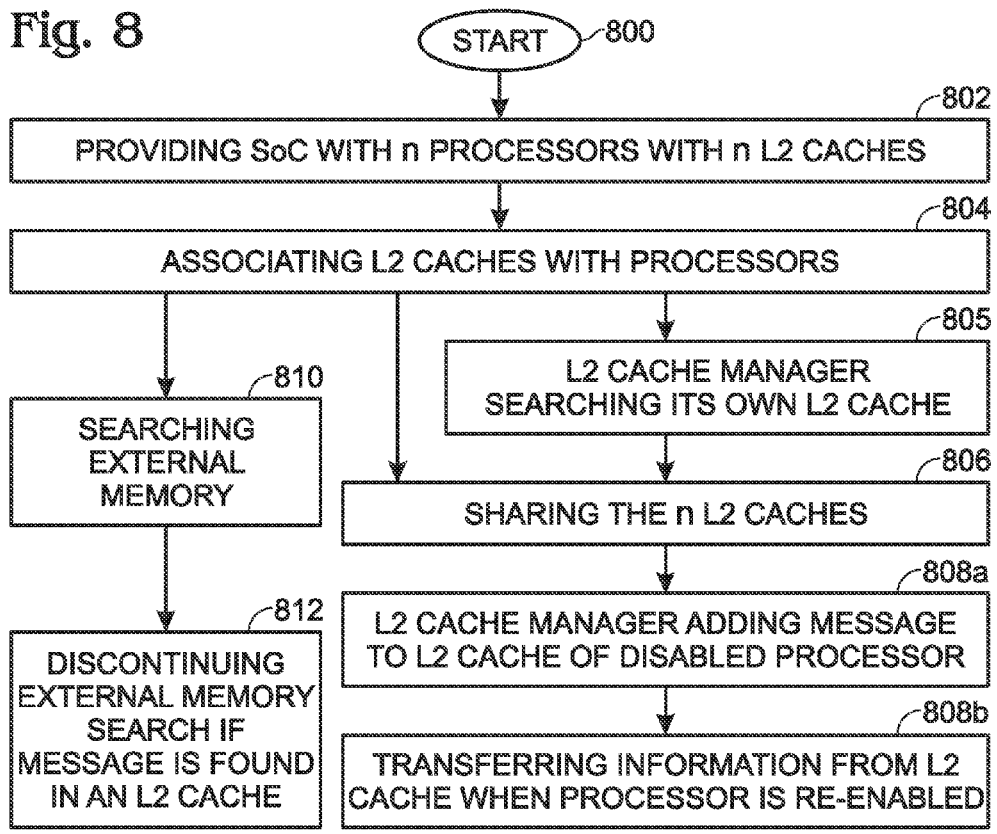
FIG. 8 is a flowchart illustrating a method for adaptively configuring L2 cache memory usage in a system of microprocessors.

FIG. 8 is a flowchart illustrating a method for adaptively configuring L2 cache memory usage in a system of microprocessors. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 800.

Step 802 provides a first SoC with a plurality of n selectively enabled processor cores and a plurality of n L2 cache memories. Step 804 associates each L2 cache with a corresponding processor core. In one aspect, Step 804 connects each processor core to its L2 cache using an L2 data/address bus. Step 806 shares the n L2 caches between enabled processor cores. In one aspect, Step 806 connects each processor core to each L2 cache via a data/address bus mesh with dedicated point-to-point connections.

Subsequent to disabling a first processor core, in Step 808*a* a second L2 cache manager associated with an enabled second processor adds a message to a first L2 cache associated with the first processor core. In one variation Step 802 provides the first SoC with an input/output (IO) interface connected to an external memory. Subsequent to enabling the previously disabled first processor core, Step 808*b* transfers information stored in a first L2 cache, associated with the first processor core, by processor cores other than the first processing core, to external memory. Alternatively, the data stored by the processors other than the first processor is simply dumped, or all the data in the cache is flushed to an external memory.

In another variation, in Step 805 a second L2 cache manager associated with an enabled second processor searches its second L2 cache for a first message. Then, sharing the n L2 caches in Step 806 includes the second L2 cache manager searching for the first message in the other (n−1) shared L2 caches. The second L2 cache manager may search the (n−1) shared L2 caches either simultaneously with, or subsequent to searching its own L2 cache.

In one aspect, in Step 810, the second L2 cache manager reads the first message from the external memory while simultaneously searching the other (n−1) shared L2 caches. In the event of finding the first message in an L2 cache, Step 812 discontinues the read (lookup) in the external memory. Alternatively as shown in FIG. 4, Step 810 may be performed after Step 806. It should be remembered that an external memory read is relatively slow compared to a cache operation.

In another aspect, Step 802 provides the first SoC with an external IO interface connected to its L2 data/address bus mesh. Step 802 also provides a second SoC including at least one selectively enabled processor core, associated L2 cache, an L2 data/address bus mesh connected to its L2 cache, and an external IO interface connected to its L2 data/address bus mesh and the IO port of the first SoC. Then, sharing the L2 caches in Step 806 includes sharing the L2 caches of the first and second SoCs with enabled processor cores in the first and second SoCs.

In one variation, in Step 805 a second L2 cache manager associated with an enabled second processor searches its second L2 cache for a first message. Then, sharing the n L2 caches in Step 806 includes the second L2 cache manager searching for the first message in the shared L2 caches of the first and second SoCs. In Step 810, simultaneous with searching the shared L2 caches, the second L2 cache manager searches for the first message in the external memory. In the event of finding the first message in an L2 cache, Step 812 discontinues the search in the external memory. In this configuration, subsequent to disabling a first processor core in the second SoC, in Step 808*a* a second L2 cache manager, associated with an enabled second processor in the first SoC, adds a message to a first L2 cache associated with the first processor core.

A system and method have been provided for adaptively configuring L2 cache memory usage in a system of microprocessors. Examples of particular message structures, processors, and hardware units have been presented to illustrate the invention. However, the invention is not limited to merely these examples. Other variations and embodiments of the invention will occur to those skilled in the art.

We claim:

1. A method for configuring L2 cache memory usage, the method comprising:
   providing a first system-on-chip (SoC) comprising:
      a plurality of processor cores;
      a plurality of L2 cache memories; and
      an input/output (IO) interface connected to an external memory;
   associating each L2 cache with a corresponding processor core selected from the plurality of processor cores;
   sharing the L2 caches among the plurality of processor cores by connecting each processor core to each L2 cache via a data/address bus mesh with dedicated point-to-point connections; and
   transferring information stored in a first L2 cache associated with the first processor core by utilizing processor cores other than the first processing core, to the external memory.

2. The method of claim 1 wherein associating each L2 cache with the corresponding processor core comprises connecting each processor core to its associated L2 cache using an L2 data/address bus.

3. The method of claim 1 further comprising:
   a second L2 cache manager associated with an enabled second processor searching an associated second L2 cache for a first message; and, wherein sharing the L2 caches comprises the second L2 cache manager searching for the first message in another shared L2 cache.

4. The method of claim 3 wherein searching for the first message in another (n−1) shared L2 caches comprises the second L2 cache manager searching the other (n−1) shared L2 caches and searching its associated L2 cache.

5. The method of claim 3 wherein providing the first SoC comprises providing an IO interface connected to an external memory; and wherein the method further comprises:
the second L2 cache manager reading the first message from the external memory while searching another (n−1) shared L2 cache; and,
on finding the first message in an L2 cache, discontinuing the read from the external memory.

6. The method of claim 1 further comprising:
a second L2 cache manager associated with an enabled second processor adding a message to a first L2 cache associated with a disabled first processor core.

7. The method of claim 1 wherein providing the first SoC comprises providing the first SoC with an external IO interface connected to its L2 data/address bus mesh, and providing a second SoC comprising at least one enabled processor core, an associated L2 cache, an L2 data/address bus mesh connected to its L2 cache, and an external IO interface connected to its L2 data/address bus mesh and the IO port of the first SoC; and
wherein sharing the L2 caches comprises sharing the L2 caches of the first and second SoCs with enabled processor cores in the first and second SoCs.

8. The method of claim 7 wherein providing the first SoC includes providing an IO interface connected to an external memory; and wherein the method further comprises:
a second L2 cache manager associated with an enabled second processor searching its associated second L2 cache for a first message;
wherein sharing the plurality of L2 caches comprises the second L2 cache manager searching for the first message in the shared L2 caches of the first and second SoCs;
the method further comprising:
the second L2 cache manager reading the first message from the external memory; and on finding the first message in an L2 cache, discontinuing the read from the external memory.

9. The method of claim 7 further comprising:
a second L2 cache manager, associated with an enabled second processor in the first SoC, adding a message to a first L2 cache associated with a disabled first processor core.

10. A system-on-chip (SoC) comprising:
a first SoC comprising a plurality of processor cores;
a plurality of L2 caches, each L2 cache associated with a corresponding processor core;
a data/address bus mesh with dedicated point-to-point connections between each processor core and each L2 cache;
an input/output (IO) interface connected to an external memory; and
a main data/address bus connecting each processor core to the IO interface, wherein a first L2 cache associated with a first processor core transfers information stored in the first L2 cache by processor cores other than the first processing core, to the external memory.

11. The system of claim 10 wherein each L2 cache comprises a cache manager,
and wherein a second cache manager associated with an enabled second processor searches an associated second L2 cache for a first message, and searches for the first message in another shared L2 cache.

12. The system of claim 11 wherein the second cache manager searches another shared L2 cache and searches its associated L2 cache.

13. The system of claim 11 further comprising:
an IO interface connected to an external memory;
a main data/address bus connecting each processor core to the IO interface;
wherein the second L2 cache manager reads the first message from the external memory while searching another shared L2 cache, and on finding the first message in an L2 cache, discontinues the read from the external memory.

14. The system of claim 10 wherein a second cache, associated with an enabled second processor core, adds a message to a first L2 cache associated with a disabled first processor core.

15. The system of claim 10 further comprising:
a first IO interface connected to the first SoC L2 data/address bus mesh, and connected to an IO interface of a second SoC;
the second SoC comprising at least one enabled processor core, an associated L2 cache, and an L2 data/address bus mesh connected to its L2 cache and its IO interface; and
wherein the plurality of L2 caches and the L2 cache associated with the second SoC are shared between enabled processor cores in the first and second SoCs.

16. The system of claim 15 further comprising:
a first SoC second IO interface connected to an external memory;
a first SoC main data/address bus connecting each processor core to the second IO interface;
wherein a second L2 cache associated with an enabled second processor core in the first SoC searches its associated second L2 cache for a first message, searches for the first message in the shared L2 caches of the first and second SoCs while reading the first message from the external memory, and on finding the first message in an L2 cache, discontinues the read from the external memory.

17. The system of claim 15 wherein a second L2 cache associated with an enabled processor core in the first SoC, adds a message to a first L2 cache associated with the first processor core in the second SoC.

* * * * *